United States Patent
Liu et al.

(10) Patent No.: US 8,324,118 B2
(45) Date of Patent: Dec. 4, 2012

(54) MANUFACTURING METHOD OF METAL GATE STRUCTURE

(75) Inventors: Chih-Chien Liu, Taipei (TW); Chun-Yuan Wu, Yulin County (TW); Chin-Fu Lin, Tainan (TW); Teng-Chun Tsai, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/072,795

(22) Filed: Mar. 28, 2011

(65) Prior Publication Data

US 2012/0248507 A1    Oct. 4, 2012

(51) Int. Cl.
    *H01L 21/31*    (2006.01)
(52) U.S. Cl. ........................................................ 438/785
(58) Field of Classification Search .................. 438/142, 438/197, 763, 758, 778, 785
    See application file for complete search history.

(56) References Cited

U.S. PATENT DOCUMENTS

| | | | |
|---|---|---|---|
| 5,498,768 A | 3/1996 | Nishitani et al. | |
| 6,063,698 A | 5/2000 | Tseng et al. | |
| 6,251,761 B1 | 6/2001 | Rodder et al. | |
| 6,380,104 B1 | 4/2002 | Yu | |
| 6,696,345 B2 | 2/2004 | Chau et al. | |
| 6,818,517 B1 | 11/2004 | Maes | |
| 6,818,553 B1 | 11/2004 | Yu et al. | |
| 6,841,484 B2 | 1/2005 | Ying et al. | |
| 6,921,711 B2 | 7/2005 | Cabral, Jr. et al. | |
| 7,012,027 B2 | 3/2006 | Perng et al. | |
| 7,030,430 B2 | 4/2006 | Doczy et al. | |
| 7,126,199 B2 | 10/2006 | Doczy et al. | |
| 7,157,378 B2 | 1/2007 | Brask et al. | |
| 7,160,767 B2 | 1/2007 | Brask et al. | |
| 7,208,366 B2 | 4/2007 | Tsai | |
| 7,381,608 B2 | 6/2008 | Brask et al. | |
| 7,384,880 B2 | 6/2008 | Brask et al. | |
| 7,488,656 B2 | 2/2009 | Cartier et al. | |
| 2002/0130340 A1 | 9/2002 | Ma et al. | |
| 2004/0007561 A1 | 1/2004 | Nallan et al. | |
| 2005/0275035 A1 | 12/2005 | Mathew et al. | |
| 2006/0091482 A1* | 5/2006 | Kim et al. | 257/401 |
| 2006/0197227 A1* | 9/2006 | Liang et al. | 257/761 |
| 2008/0070395 A1 | 3/2008 | Yen et al. | |
| 2008/0233762 A1* | 9/2008 | Hong | 438/763 |
| 2009/0057787 A1 | 3/2009 | Matsuki et al. | |
| 2010/0062592 A1 | 3/2010 | Clark | |
| 2010/0068877 A1 | 3/2010 | Yeh et al. | |
| 2010/0081262 A1 | 4/2010 | Lim et al. | |
| 2011/0003482 A1* | 1/2011 | Ogawa et al. | 438/763 |
| 2011/0024875 A1* | 2/2011 | Takebayashi et al. | 257/532 |

OTHER PUBLICATIONS

Sigma-Aldrich Chemie GmbH, SIGMA-ALDRICH safety data sheet, Jul. 27, 2010.

* cited by examiner

*Primary Examiner* — Thomas L Dickey
*Assistant Examiner* — Nikolay Yushin
(74) *Attorney, Agent, or Firm* — Winston Hsu; Scott Margo

(57) ABSTRACT

A manufacturing method of a metal gate structure includes providing a substrate having at least a first metal oxide layer formed thereon, and transferring the surface of the first metal oxide layer into a second metal oxide layer. The first metal oxide layer includes a metal oxide ($M1O_x$) of a first metal (M1) and the second metal oxide layer includes a metal oxide (($M1M2O_y$) of the first metal and a second metal (M2).

10 Claims, 5 Drawing Sheets

MANUFACTURING METHOD OF METAL GATE STRUCTURE

BACKGROUND OF THE INVENTION

1. Field of the Invention

The invention relates to a metal gate structure and a manufacturing method thereof, and more particularly, to high dielectric constant (high-K) gate dielectric layer of a metal gate structure and a manufacturing method thereof.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

According to an aspect of the present invention, there is provided a manufacturing method of a metal gate structure. The manufacturing method includes providing a substrate having at least a first metal oxide layer formed thereon, and transferring the surface of the first metal oxide layer to form a second metal oxide layer. The first metal oxide layer includes a metal oxide ($M1O_x$) of a first metal (M1) and the second metal oxide layer includes a metal oxide ($M1M2O_y$) of the first metal and a second metal (M2).

According to another aspect of the present invention, there is provided a metal gate structure. The metal gate structure includes a first metal oxide layer having a metal oxide ($M1O_x$) of a first metal (M1), a second metal oxide layer positioned on the first metal oxide layer, and a work function metal layer positioned on the second metal oxide layer. The second metal oxide layer has a metal oxide ($M1M2O_y$) of the first metal and a second metal (M2), and an atomic number of the second metal is smaller than an atomic number of the first metal.

According to the metal gate structure and the manufacturing method thereof provided by the present invention, the second metal oxide layer having the metal oxide $M1M2O_y$ of the first metal M1 and the second metal M2 is formed on the surface of the first metal oxide layer, which has the metal oxide $M1O_x$ of the first metal M1. Since the atomic number of the second metal M2 is smaller than the atomic number of the first metal M1, the second metal M2 is able to fill in the interstices of the metal oxide $M1O_x$ of the first metal M1. Accordingly, leakage from the gate dielectric layer is prevented. Furthermore, since the first metal oxide layer includes the metal oxide $M1O_x$ of the first metal M1 and the second metal oxide layer includes the metal oxide $M1M2O_y$ of the first metal M1 and the second metal M2, the first metal oxide layer and the second metal oxide layer form a hybrid gate dielectric layer. Accordingly, the formed gate dielectric layer is prevented from crystallization, which undesirably reduces the dielectric constant.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 7-10 are schematic drawings illustrating a manufacturing method of metal gate structure provided by a third preferred embodiment of the present invention, wherein FIG. 9 is a schematic drawing illustrating a modification to the present invention.

DETAILED DESCRIPTION

Figure 1:
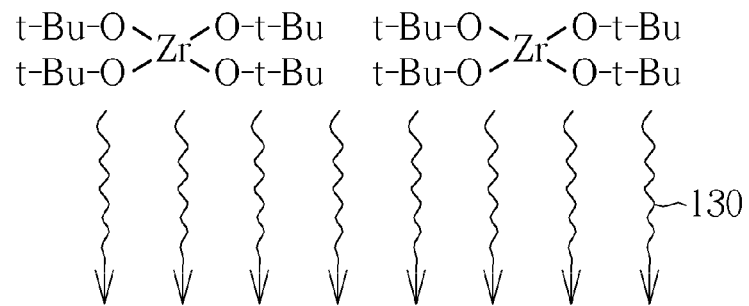
FIGS. 1-3 are schematic drawings illustrating a manufacturing method of metal gate structure provided by a first preferred embodiment of the present invention.
Figure 1:
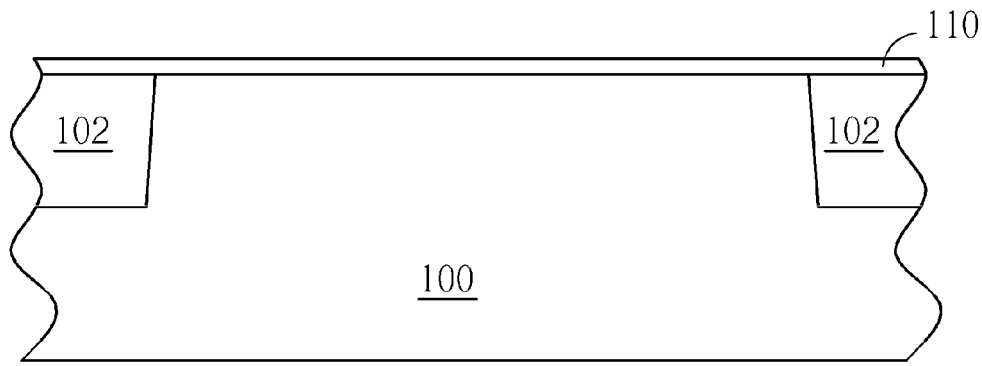
Figure 2:
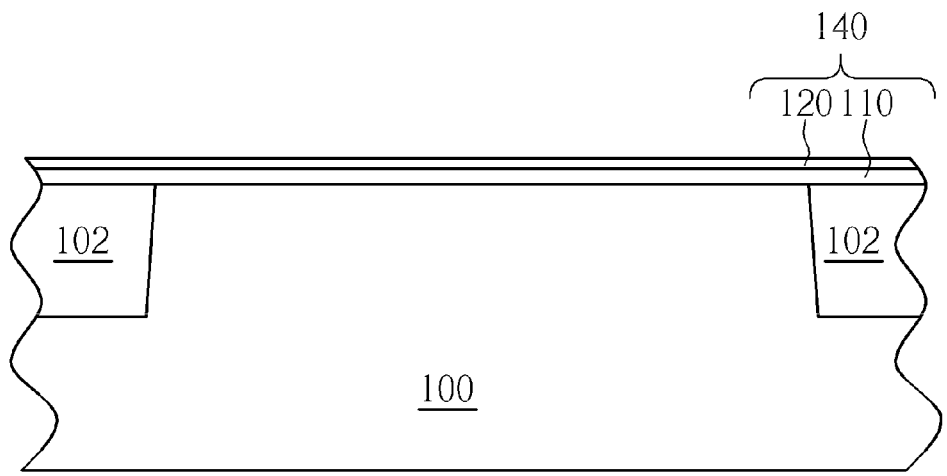
Figure 3:
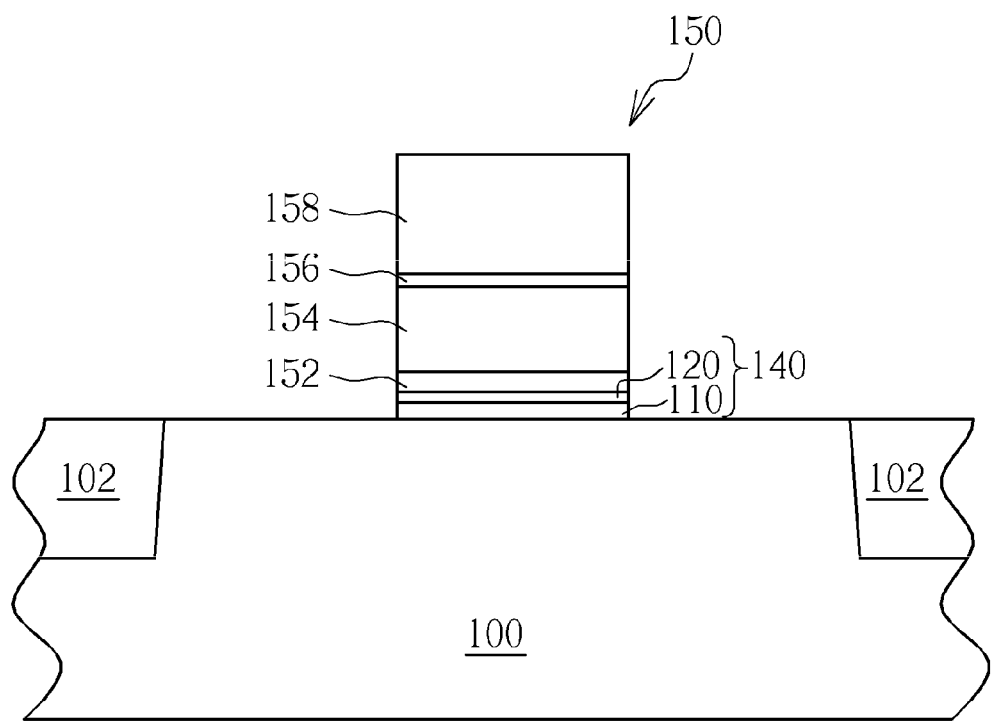

Please refer to FIGS. 1-3, which are schematic drawings illustrating a manufacturing method of metal gate structure provided by a first preferred embodiment of the present invention. It is noteworthy that the preferred embodiment is applied with the gate-first process. As shown in FIG. 1, a substrate 100 such as a silicon substrate, a silicon-containing substrate, or a silicon-on-insulator (SOI) substrate is provided. The substrate 100 includes a plurality of shallow trench isolations (STIs) 102 for providing electrical isolation formed therein.

Next, a first metal oxide layer 110 is formed on the substrate 100. The first metal oxide layer 110 includes high-K materials, and a dielectric constant of the first metal oxide layer 110 is higher than 7. The high-K material includes a metal oxide $M1O_x$ of a first metal M1. In the preferred embodiment, the first metal M1 preferably is hafnium (Hf) and thus the metal oxide $M1O_x$ of the first metal oxide layer 110 is hafnium oxide ($HfO_2$). However, the first metal M1 can include aluminum (Al), lanthanum (La), tantalum (Ta), yttrium (Y) or zirconium (Zr), and thus the first metal oxide layer 110 includes metal oxide $M1O_x$ of the abovementioned metals such as aluminum oxide ($Al_2O_3$), lanthanum oxide ($La_2O_3$), tantalum oxide ($Ta_2O_5$), yttrium oxide ($Y_2O_3$) or zirconium oxide ($ZrO_2$). It is noteworthy that an interfacial layer (not shown) including silicon oxide is formed on the substrate 100 prior to the first metal oxide layer 110.

Please refer to FIG. 1 and FIG. 2. Next, a step of transferring the surface of the first metal oxide layer 110 is performed. Accordingly, the surface of the first metal oxide layer 110 is transferred to form a second metal oxide layer 120. The second metal oxide layer 120 includes a metal oxide $M1M2O_y$ of the first metal M1 and a second metal M2. In detail, surface treatment such as plasma treatment, ion implantation, diffusion, replacement, dipping treatment can be used to transfer the surface of the first metal oxide layer 110 to form the second metal oxide layer 120. According to the preferred embodiment, a dipping treatment is performed.

As shown in FIG. 1 and FIG. 2, a solution 130 is used to transfer the surface of the first metal oxide layer 110 to form the second metal oxide layer 120. It is noteworthy that the solution 130 includes the second metal M2. An atomic number of the second metal M2 is smaller than an atomic number of the first metal M1, and the first metal M1 and the second metal M2 are preferably in the same group. For example, the first metal M1 is Hf in the preferred embodiment, therefore the second metal M2 can be Zr, but not limited to this. Additionally, the solution 130 further includes a metal chelating agent, such as tetra-n-butyl zirconate, but not limited to this:

Because of the metal chelating agent, a chelation reaction between Zr and $HfO_2$ of the first metal oxide layer 110 is caused. Therefore the surface of the first metal oxide layer 110 is transferred to form the second metal oxide layer 120 having the metal oxide $M1M2O_y$ of the first metal M1 and the second metal M2. A thickness of the second metal oxide layer 120 is smaller than a thickness of the first metal oxide layer 110. In the preferred embodiment, the second metal oxide layer 120 includes hafnium zirconium oxide ($HfZrO_4$).

It is noteworthy that since the atomic number of the second metal M2 (the second metal M2 is Zr in the preferred embodiment) is smaller than the atomic number of the first metal M1 (the first metal M1 is Hf in the preferred embodiment), the second metal Zr not only is reacted with the metal oxide $HfO_2$ of the first metal oxide layer 110, the second metal Zr but also fill in the interstices of the metal oxide $HfO_2$ of the first metal oxide layer 110. Accordingly, leakage from the first metal oxide layer 110 due to the interstices is prevented by forming the second metal oxide layer 120. Furthermore, since the first metal oxide layer 110 includes $HfO_2$ and the second metal oxide layer 120 includes $HfZrO_4$, the first metal oxide layer 110 and the second metal oxide layer 120 form a hybrid gate dielectric layer 140, accordingly the hybrid gate dielectric layer 140 is prevented from crystallization, which undesirably reduces the dielectric constant.

Pleas refer to FIG. 3. Then, a metal gate structure 150 is formed on the substrate 100 and the second metal oxide layer 120. As mentioned above, the preferred embodiment is applied with the high-K first process. Therefore, the metal gate structure 150 is formed by sequentially forming a bottom barrier layer 152, a work function metal layer 154, a top barrier layer 156, and a low resistance metal layer 158 on the second metal oxide layer 120. The bottom barrier layer 152 includes materials selected from the group consisting of titanium nitride (TiN) and tantalum nitride (TaN), but not limited to this. The work function metal layer 154 is formed to have metal material with work function between 3.9 eV and 4.3 eV if the metal gate structure 150 is a gate of an n-type semiconductor device, or is formed to have metal material with work function between 4.8 eV and 5.2 eV if the metal gate structure 150 is a gate of a p-type semiconductor device. The top barrier layer 156 includes materials selected from the group consisting of TiN and titanium oxynitride (TiON), but not limited to this. The low resistance metal layer 158 includes materials with low resistance and superior gap-filling characteristic, such as Al or silicide, but not limited to this. After forming the above mentioned layers, a patterning process is performed to pattern the low resistance metal layer 158, the top barrier layer 156, the work function metal layer 154, the bottom barrier layer 152, the second metal oxide layer 120, and the first metal oxide layer 110. Consequently, a metal gate structure 150 as shown in FIG. 3 is obtained. Because the steps of forming the bottom barrier layer 152, forming the work function metal layer 154, forming the top barrier layer 156, forming the low resistance metal layer 158, and performing the patterning process are well-known to those skilled in the art, those details are omitted herein in the interest of brevity.

Figure 4:
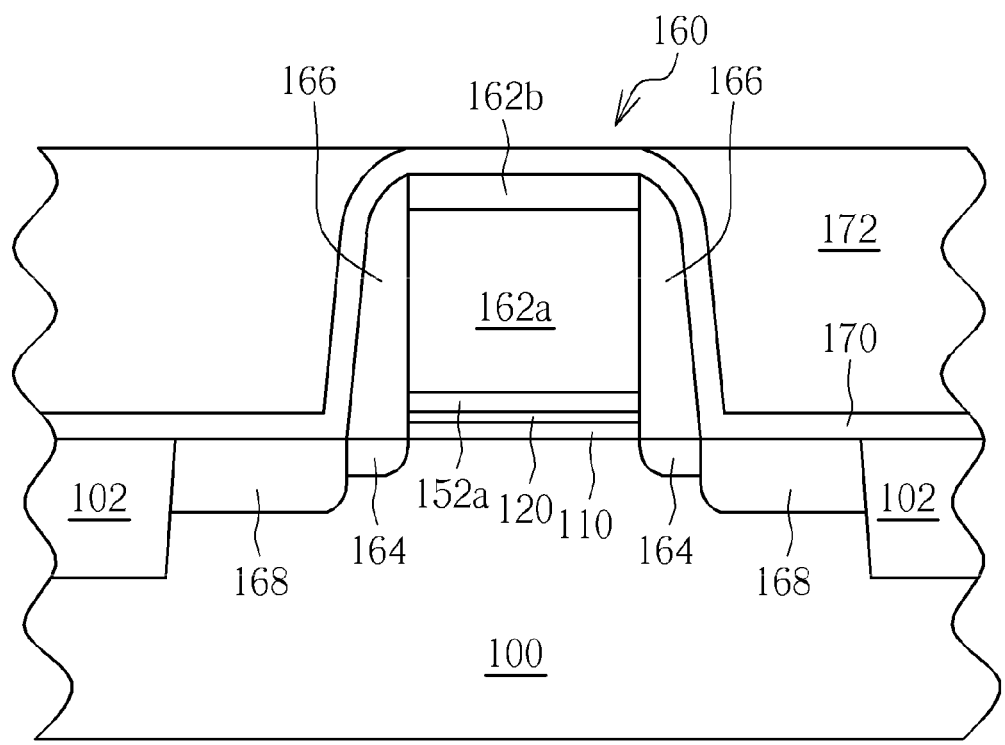
FIGS. 4-6 are schematic drawings illustrating a manufacturing method of metal gate structure provided by a second preferred embodiment of the present invention.
Figure 5:
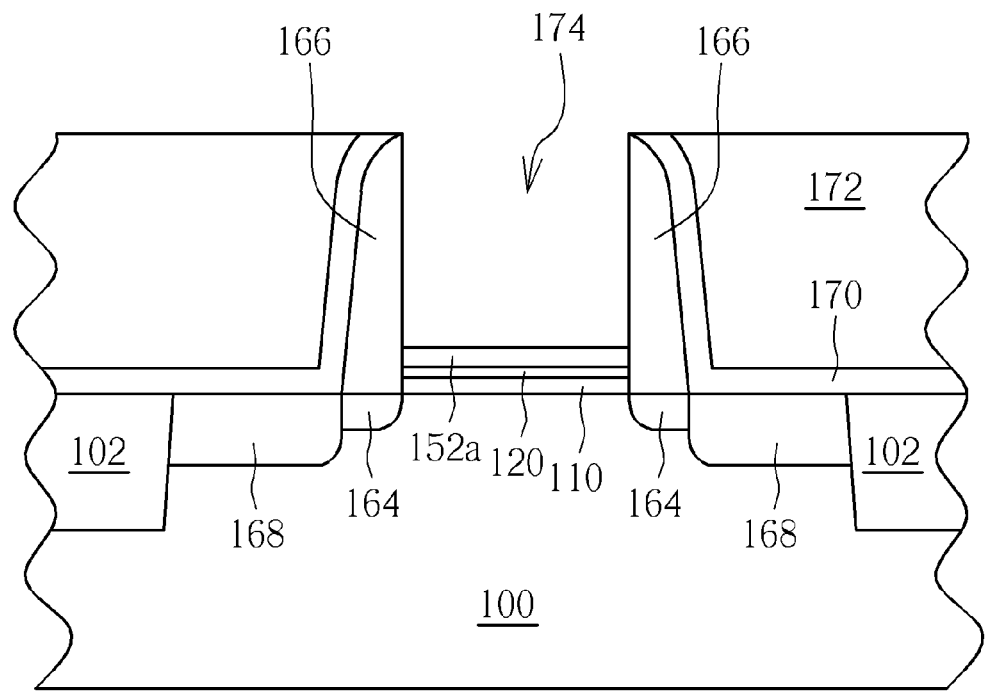
Figure 6:
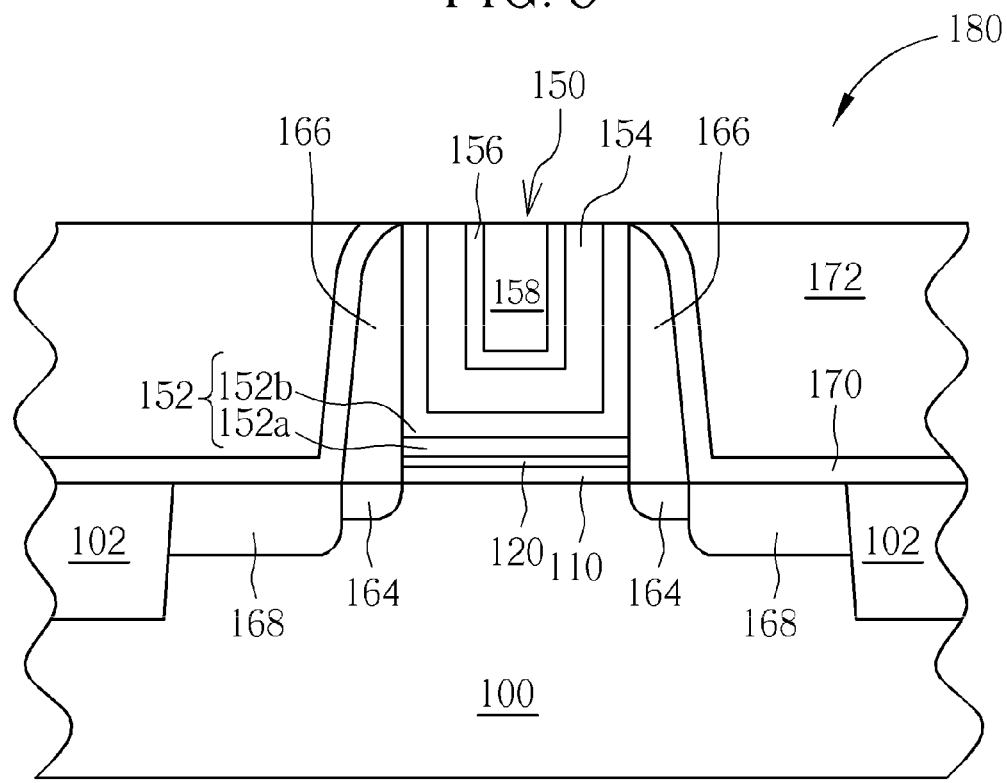

Please refer to FIGS. 4-6, which are schematic drawings illustrating a manufacturing method of metal gate structure provided by a second preferred embodiment of the present invention. Because the steps of forming the first metal oxide layer 110 and the second metal oxide layer 120 are the same in both the first and the second preferred embodiments, the elements the same in the first and second preferred embodiment are designated by the same numerals, and those steps are omitted for the sake of simplicity. It is noteworthy that the second preferred embodiment is applied with the gate-last process and the high-K first process. Therefore the first metal oxide layer 110, the second metal oxide layer 120 and the TiN layer 152a that serving as a portion of the bottom barrier layer 152 are formed on the substrate 100 as shown in FIG. 4 by the steps as mentioned in the first preferred embodiment.

As shown in FIG. 4, next, a polysilicon layer 162a and a patterned hard mask 162b are formed on the TiN layer 152a and followed by performing a patterning process. Consequently, a dummy gate 160 is formed on the substrate 100. After forming the dummy gate 160, lightly doped drains (LDDs) 164 are formed in the substrate 100 at two sides of the dummy gate 160, a spacer 166 is formed on the sidewalls of the dummy gate 160, and a source/drain 168 is formed in the substrate 100 at two sides of the spacer 166. Furthermore, selective strain scheme (SSS) can be used in the preferred embodiment. For example, the selective epitaxial growth (SEG) can be used to form the source/drain 168: When the source/drain 168 is a p-type source/drain, epitaxial silicon layers with silicon germanium (SiGe) can be used to form the p-type source/drain 168; and when the source/drain 168 is an n-type source/drain, epitaxial silicon layers with silicon carbide (SiC) can be used to form the n-type source/drain 168. Additionally, silicides (not shown) are formed on the surface of the source/drain 168. Thereafter, a contact etch stop layer (CESL) layer 170 and an inter-layer dielectric (ILD) 172 layer are sequentially formed on the substrate 100. Since the steps of forming the above mentioned elements are well-known to those skilled in the art, those details are omitted herein in the interest of brevity.

Please refer to FIG. 5. Then, a planarization process is performed to remove a portion of the ILD layer 172, a portion of the CESL 170, and the patterned hard mask 162b to expose the polysilicon layer 162a. Next, a proper etching process is performed to remove the polysilicon layer 162a to form a gate trench 174. In the etching process, the TiN layer 152a serves as an etch stop layer for protecting the second metal oxide layer 120 from damage in the etching process. As shown in FIG. 5, the first metal oxide layer 110, the second metal oxide layer 120 and the TiN layer 152a are formed in the bottom of the gate trench 174. Since the planarization process and the etching process are well-known to those skilled in the art, the details are omitted for the sake of simplicity.

Please refer to FIG. 6. Next, a TaN layer 152b that serving as the bottom barrier layer 152 with the TiN layer 152a, a work function metal layer 154, a top barrier layer 156, and a low resistance metal layer 158 are sequentially formed in the gate trench 174. And the gate trench 174 is filled up with the low resistance metal layer 158. Then, a planarization process is performed to remove unnecessary low resistance metal layer 158, top barrier layer 156, work function metal layer 154, and TaN layer 152b. Consequently, the metal gate structure 150 and a semiconductor device 180 having the metal gate structure 150 are obtained. In addition, the ILD layer 172 and the CESL 170 can be selectively removed and sequentially reformed on the substrate 100 for improving performance of the semiconductor device 180 in the preferred embodiment.

According to the manufacturing method of metal gate structure provided by the first preferred embodiment and the second preferred embodiment, the atomic number of the second metal M2 (the second metal M2 is Zr in the preferred embodiments) is smaller than the atomic number of the first metal M1 (the first metal M1 is Hf in the preferred embodiments). And a chelating reaction between the second metal M2 and the first metal oxide layer 110 is caused by providing the solution 130 having the metal chelating agent. Accordingly the second metal oxide layer 120 having $HfZrO_4$ is formed on the first metal oxide layer 110. Since the atomic number of second metal M2 is smaller than the atomic number of the first metal M1, the second metal M2 is able to fill in the interstices of the metal oxide $M1O_x$ of the first metal M1. Accordingly, leakage from the gate dielectric layer is prevented. Furthermore, since the first metal oxide layer 110 and the second metal oxide layer 120 form the hybrid gate dielectric layer 140, the hybrid gate dielectric layer 140 is prevented from crystallization, which undesirably reduces the dielectric constant.

Figure 7:
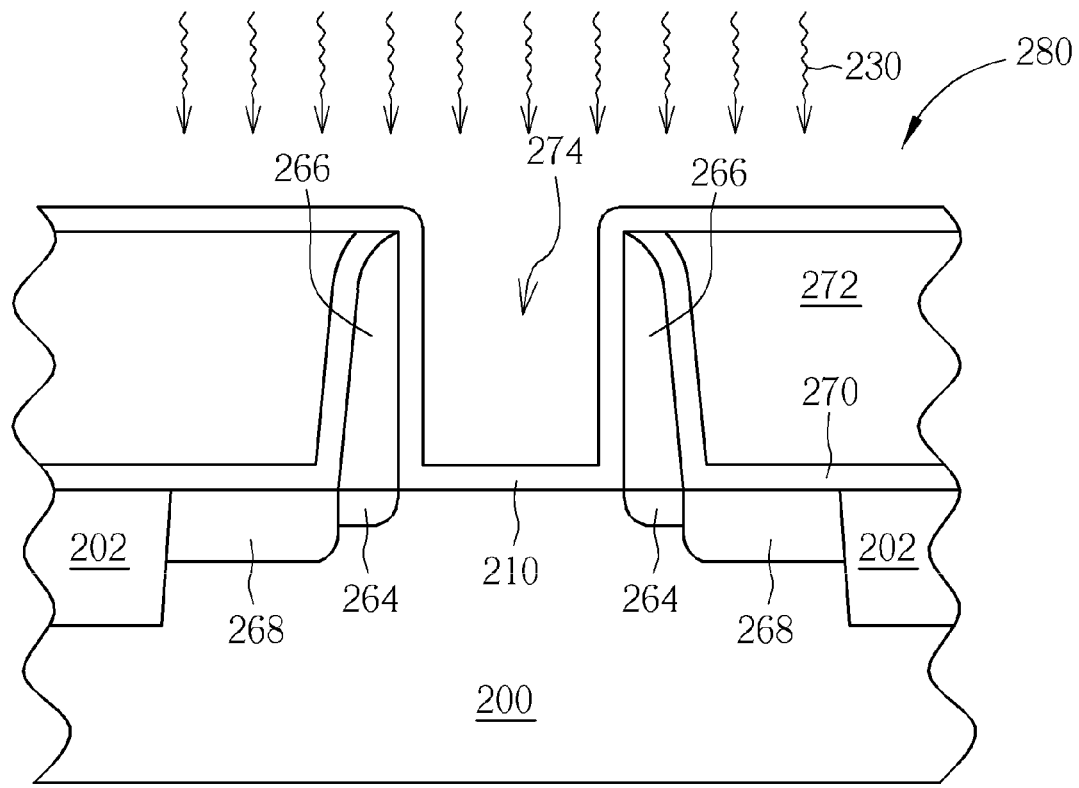

Please refer to FIGS. 7-10, which are schematic drawings illustrating a manufacturing method of metal gate structure provided by a third preferred embodiment of the present invention. It is noteworthy that the third preferred embodiment is applied with the gate-last process and the high-K last process. Additionally, material choices for elements the same in the first, the second and the third preferred embodiments are omitted herein in the interest of brevity. As shown in FIG. 7, the preferred embodiment first provides a substrate 200 having a plurality of STIs 202 for providing electrical isolation. Then, at least a semiconductor device 280 is formed on the substrate 200.

The semiconductor device 280 includes a gate structure (not shown) having a gate dielectric layer (not shown), a dummy gate such as a polysilicon layer (not shown) and a patterned hard mask (not shown). Those layers are sequentially and upwardly stacked on the substrate 200. Additionally, an interfacial layer (not shown) including silicon oxide can be formed on the substrate 200 prior to the gate dielectric layer. Because the preferred embodiment is applied with the high-K last process as mentioned above, the gate dielectric layer preferably is a conventional silicon oxide gate dielectric layer.

Please refer to FIG. 7 again. The semiconductor device 280 further includes LDDs 264 formed in the substrate 200 at two sides of the gate structure, a spacer 266 formed on the sidewalls of the gate structure, a source/drain 268 formed in the substrate 200 at two sides of the spacer 266, and silicides (not shown) formed on the surface of the source/drain 268. As mentioned above, the SEG method can be used to form an n-type source/drain 268 having SiC epitaxial layer or a p-type source/drain 268 having SiGe epitaxial layer. Furthermore, a CESL layer 270 and an ILD layer 272 are sequentially formed on the substrate 200 and the semiconductor device 280. Since the steps for forming the above mentioned elements are well-known to those skilled in the art, those details are omitted herein in the interest of brevity.

Please still refer to FIG. 7. Next, a planarization process is performed to remove a portion of the ILD layer 272, a portion of the CESL 270 and the patterned hard mask to expose the top of the dummy gate. Then, a proper etching process is performed to remove the dummy gate. Consequently, a gate trench 274 is formed as shown in FIG. 7. After forming the gate trench 274, a first metal oxide layer 210 is formed in the gate trench 274 and on the substrate 200. The first metal oxide layer 210 includes high-K materials, and a dielectric constant of the first metal oxide layer 210 is higher than 7. The high-K material includes a metal oxide $M1O_x$ of a first metal M1. In the preferred embodiment, the first metal M1 preferably is Hf and thus the metal oxide $M1O_x$ of the first metal oxide layer 210 is $HfO_2$. However, the first metal M1 can include Al, La, Ta, Y, or Zr, and thus the first metal oxide layer 210 includes metal oxide $M1O_x$ of the abovementioned metals such as $Al_2O_3$, $La_2O_3$, $Ta_2O_5$, $Y_2O_3$, or $ZrO_2$.

Figure 8:
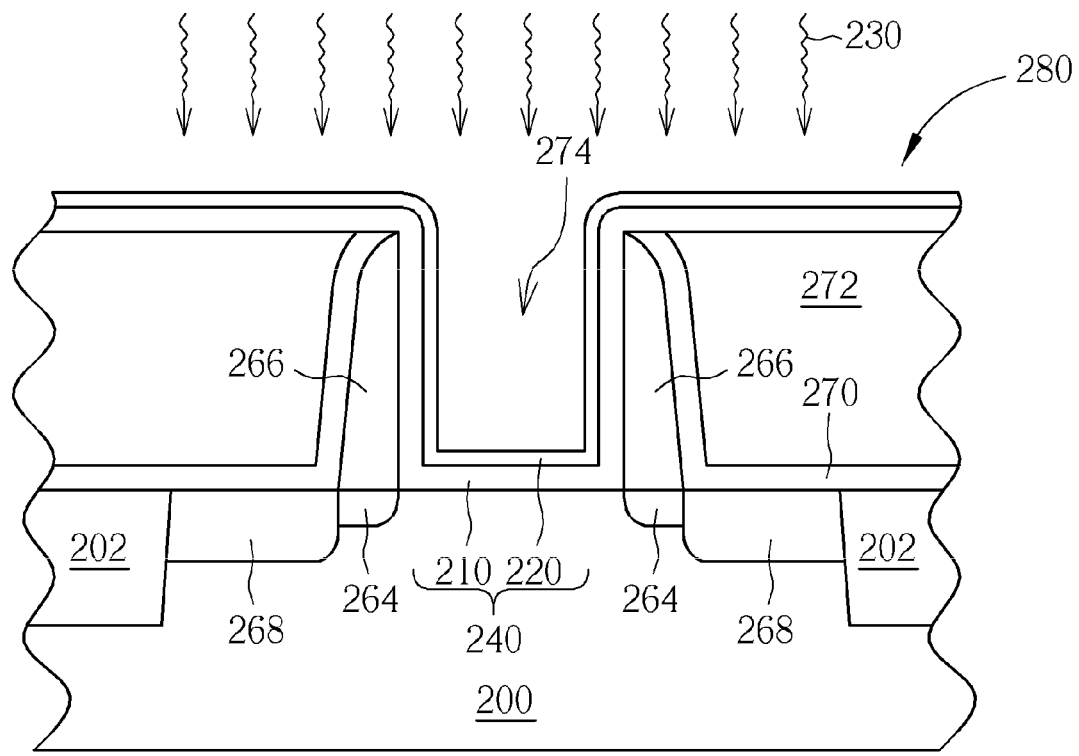

Please refer to FIG. 7 and FIG. 8. Next, a step of transferring the surface of the first metal oxide layer 210 is performed. Accordingly, the surface of the first metal oxide layer 210 is transferred to form a second metal oxide layer 220. The second metal oxide layer 220 includes a metal oxide $M1M2O_y$ of the first metal M1 and a second metal M2. As shown in FIG. 7, the preferred embodiment is applied with a surface treatment such as a dipping treatment. As shown in FIG. 7 and FIG. 8, a solution 230 is used to transfer the surface of the first metal oxide layer 210 to form the second metal oxide layer 220. It is noteworthy that the solution 230 includes the second metal M2. An atomic number of the second metal M2 is smaller than an atomic number of the first metal M1, and the first metal M1 and the second metal M2 are preferably in the same group. For example, the first metal M1 is Hf in the preferred embodiment, therefore the second metal M2 can be Zr, but not limited to this. Additionally, the solution 230 further includes a metal chelating agent, such as tetra-n-butyl zirconate, but not limited to this:

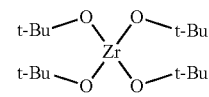

Because of the metal chelating agent, a chelation reaction between Zr and $HfO_2$ of the first metal oxide layer 210 is caused. Therefore the surface of the first metal oxide layer 210 is transferred to form the second metal oxide layer 220 having the metal oxide $M1M2O_y$ of the first metal M1 and the second metal M2. A thickness of the second metal oxide layer 220 is smaller than a thickness of the first metal oxide layer 210. In the preferred embodiment, the second metal oxide layer 220 includes $HfZrO_4$.

It is noteworthy that since the atomic number of the second metal M2 (the second metal M2 is Zr in the preferred embodiment) is smaller than the atomic number of the first metal M1 (the first metal M1 is Hf in the preferred embodiment), the second metal Zr not only is reacted with the metal oxide $HfO_2$ of the first metal oxide layer 210, the second metal Zr but also fill in the interstices of the metal oxide $HfO_2$ of the first metal oxide layer 210. Accordingly, leakage from the first metal oxide layer 210 due to the interstices is prevented by forming the second metal oxide layer 220. Furthermore, since the first metal oxide layer 210 includes $HfO_2$ and the second metal oxide layer 220 includes $HfZrO_4$, the first metal oxide layer 210 and the second metal oxide layer 220 form a hybrid gate dielectric layer 240, accordingly the hybrid gate dielectric layer 240 is prevented from crystallization, which undesirably reduces the dielectric constant.

Figure 9:
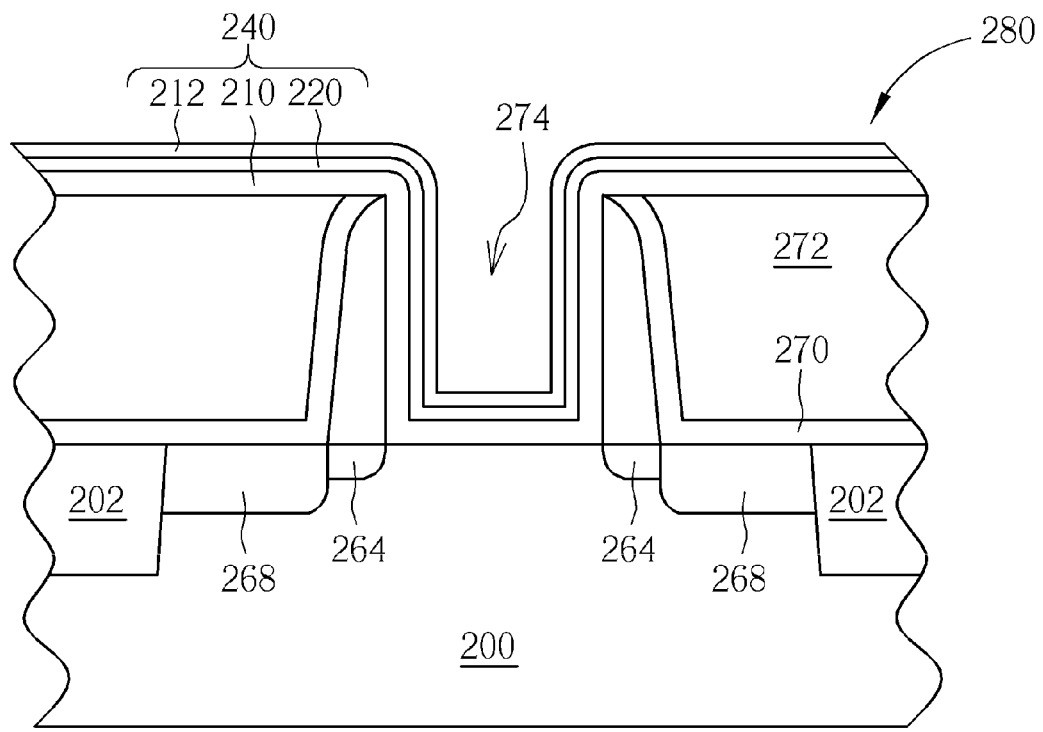

Please refer to FIG. 9, which is a schematic drawing illustrating a modification to the present invention. It is noteworthy that the present modification can be applied to not only the third preferred embodiment, but also to the first preferred embodiment and the second preferred embodiment. According to the present modification, a third metal oxide layer 212 is formed on the second metal oxide layer 220 after forming the second metal oxide layer 220. The third metal oxide layer 212 includes the metal oxide $M1O_x$ of the first metal M1, which is $HfO_2$ in all preferred embodiments. According to the modification, the second metal oxide layer 220 having $HfZrO_4$ is sandwiched between the first metal oxide layer 210 and the third metal oxide layer 212 having $HfO_2$. Thus the first metal oxide layer 210, the second metal oxide layer 220 and the third metal oxide layer 212 form a hybrid gate dielectric layer 240. And the crystallization occurred in the first metal oxide layer 210 itself, in the third metal oxide layer 212 itself, or between the first metal oxide layer 210 and the third metal oxide layer 212 are all prevented by positioning the second metal oxide layer 220 in between. In addition, since the third metal oxide layer 212 also includes the metal oxide $M1O_x$ of the first metal M1, a four metal oxide layer (not shown) can be formed by transferring the surface of the third metal oxide layer 212 with surface treatment such as the dipping treatment. The fourth metal oxide layer, which is the same with the second metal oxide layer 220, includes the metal oxide $M1M2O_y$ of the first metal M1 and the second metal M2. Briefly speaking, the steps of forming the layer having the metal oxide $M1O_x$ of the first metal M1 and of forming the layer having the metal oxide $M1M2O_y$ of the first metal M1 and the second metal M2 can be repeatedly performed to reach a predetermined thickness for a gate dielectric layer. Accordingly, the layer having the metal oxide $M1O_x$ of the first metal M1 and the layer having the metal oxide $M1M2O_y$ of the first metal M1 and the second metal M2 are periodically formed, and thus a hybrid gate dielectric layer is obtained, which prevents itself from crystallization, and thus prevents the dielectric constant from being lowered.

Figure 10:
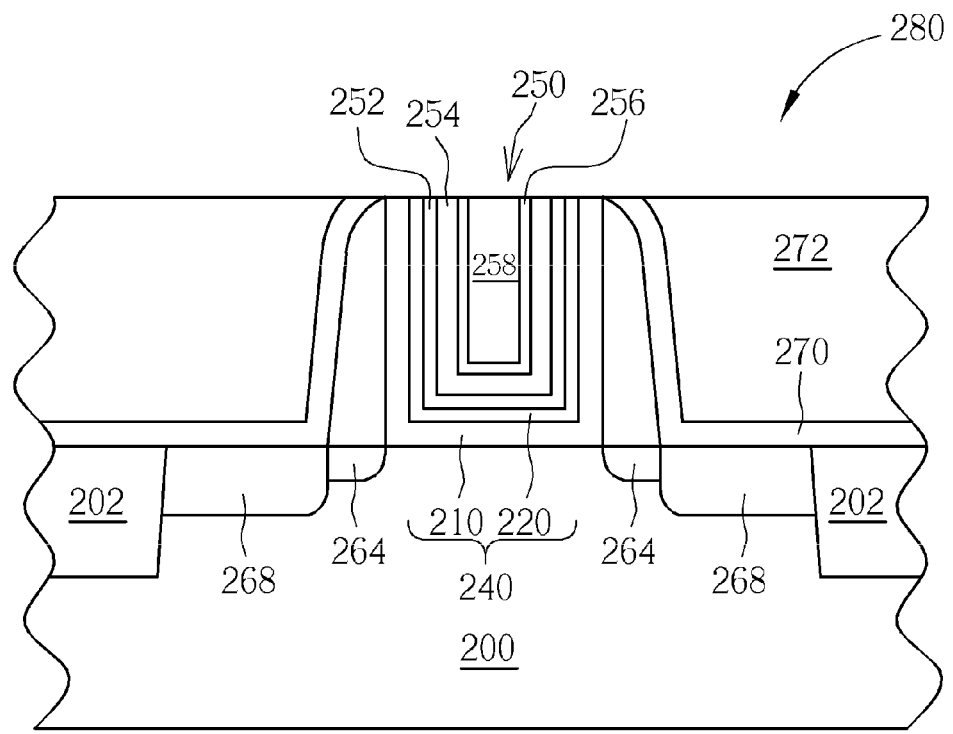

Please refer to FIG. 10. Next, a bottom barrier layer 252, a work function metal layer 254, a top barrier layer 256 and a low resistance metal layer 258 are sequentially formed on the substrate 200 and on the hybrid gate dielectric layer 240 in the gate trench 274. That is, to form the abovementioned layers on the second metal oxide layer 220 or on the third metal oxide layer 212. And the gate trench 274 is filled up with the low resistance metal layer 258. Thereafter, a planarization process is performed to remove unnecessary low resistance metal layer 258, top barrier layer 256, work function metal layer 254, the bottom barrier layer 252, and hybrid gate dielectric layer 240. Consequently, a metal gate structure 250 and a semiconductor device 280 having the metal gate structure 250 are obtained. In addition, the ILD layer 272 and the CESL 270 can be selectively removed and sequentially reformed on the substrate 200 for improving performance of the semiconductor device 280 in the preferred embodiment.

According to the manufacturing method of metal gate structure provided by the third preferred embodiment, the atomic number of the second metal M2 (the second metal M2 is Zr in the preferred embodiments) is smaller than the atomic number of the first metal M1 (the first metal M1 is Hf in the preferred embodiments). And a chelating reaction between the second metal M2 and the first metal oxide layer 210 is caused by providing the solution 230 having the metal chelating agent. Accordingly, the second metal oxide layer 220 having $HfZrO_4$ is formed on the first metal oxide layer 210. Since the atomic number of second metal M2 is smaller than the atomic number of the first metal M1, the second metal M2 is able to fill in the interstices of the metal oxide $M1O_x$ of the first metal M1. Accordingly, leakage from the gate dielectric layer is prevented. Furthermore, since the first metal oxide layer 210 and the second metal oxide layer 220 form the hybrid gate dielectric layer 240, the hybrid gate dielectric layer 240 is prevented from crystallization, which undesirably reduces the dielectric constant.

According to the manufacturing method thereof provided by the present invention, the manufacturing method can be applied with the gate-first process, the gate-last process, the high-K first process, or the high-K process. In other words, the manufacturing method provided by the present invention can be integrated with all metal gate process used in the state-of-the-art without complicating the process or worsening process difficulty. More important, by forming the second metal oxide layer having the metal oxide $M1M2O_y$ of the first metal M1 and the second metal M2 on the surface of the first metal oxide layer having the metal oxide $M1O_x$ of the first metal M1, wherein the atomic number of the second metal M2 is smaller than the atomic number of the first metal M1, the present invention uses the second metal M2 to fill in the interstices of the metal oxide $M1O_x$ of the first metal M1. Accordingly, leakage from the gate dielectric layer is prevented. Furthermore, since the first metal oxide layer includes the metal oxide $M1O_x$ of the first metal M1 and the second metal oxide layer includes the metal oxide $M1M2O_y$ of the first metal M1 and the second metal M2, the first metal oxide layer and the second metal oxide layer form a hybrid gate dielectric layer. Accordingly, the formed hybrid gate dielectric layer is prevented from crystallization, which undesirably reduces the dielectric constant and eventually deteriorates the performance of the semiconductor device. In other word, the manufacturing method of a metal gate structure is performed to provide a metal gate structure having superior reliability.

Those skilled in the art will readily observe that numerous modifications and alterations of the device and method may be made while retaining the teachings of the invention.

What is claimed is:

1. A manufacturing method of a metal gate structure comprising: providing a substrate having at least a first metal oxide layer formed thereon, the first metal oxide layer comprising a metal oxide ($M1O_x$) of a first metal (M1); and treating a surface of the first metal oxide layer to form a second metal oxide layer, the second metal oxide layer comprising a metal oxide ($M1M2O_y$) of the first metal and a second metal (M2); wherein the first metal and the second metal are in the same group.

2. The manufacturing method of a metal gate structure according to claim 1, wherein an atomic number of the second metal is smaller than an atomic number of the first metal.

3. The manufacturing method of a metal gate structure according to claim 1, wherein a thickness of the second metal oxide layer is smaller than a thickness of the first metal oxide layer.

4. The manufacturing method of a metal gate structure according to claim 1, further comprising forming at least a third metal oxide layer on the substrate, the third metal oxide layer comprises the metal oxide of the first metal.

5. The manufacturing method of a metal gate structure according to claim 1, further comprising forming a metal gate structure on the second metal oxide layer.

6. The manufacturing method of a metal gate structure according to claim 1, further comprising forming at least a gate trench on the substrate, and the second metal oxide layer is formed in the bottom of the gate trench.

7. The manufacturing method of a metal gate structure according to claim 1, further comprising:

forming at least a gate trench on the substrate; and forming the first metal oxide layer on the substrate and in the gate trench.

8. The manufacturing method of a metal gate structure according to claim 1, further comprising performing a dipping treatment to transfer the surface of the first metal oxide layer to form the second metal oxide layer with a solution.

9. The manufacturing method of a metal gate structure according to claim 8, wherein the solution further comprises the second metal.

10. The manufacturing method of a metal gate structure according to claim 8, wherein the solution further comprises a metal chelating agent.

* * * * *

UNITED STATES PATENT AND TRADEMARK OFFICE
CERTIFICATE OF CORRECTION

| | | |
|---|---|---|
| PATENT NO. | : 8,324,118 B2 | Page 1 of 1 |
| APPLICATION NO. | : 13/072795 | |
| DATED | : December 4, 2012 | |
| INVENTOR(S) | : Chih-Chien Liu et al. | |

It is certified that error appears in the above-identified patent and that said Letters Patent is hereby corrected as shown below:

On the title page, item (75), correct the residence of the second inventor from "Yulin County" to --Yunlin County--.

Signed and Sealed this
Twelfth Day of February, 2013

Teresa Stanek Rea
*Acting Director of the United States Patent and Trademark Office*